United States Patent
Jain et al.

(10) Patent No.: US 12,483,201 B1
(45) Date of Patent: Nov. 25, 2025

(54) PARAMETRIC-INSENSITIVE EDGE RATE CONTROL IN SWITCHED-POWER CIRCUITS WITH TAILORED POWER SUPPLY VOLTAGE SENSITIVITY

(71) Applicant: CIRRUS LOGIC INTERNATIONAL SEMICONDUCTOR LTD., Edinburgh (GB)

(72) Inventors: Nishant Jain, Austin, TX (US); Vamsikrishna Parupalli, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 549 days.

(21) Appl. No.: 17/982,826

(22) Filed: Nov. 8, 2022

(51) Int. Cl.
  *H03F 3/217*  (2006.01)
  *H03F 1/02*  (2006.01)
  *H03F 1/30*  (2006.01)
  *H03F 3/24*  (2006.01)

(52) U.S. Cl.
  CPC ........... *H03F 1/303* (2013.01); *H03F 1/0222* (2013.01); *H03F 3/245* (2013.01); *H03F 2200/114* (2013.01); *H03F 2200/27* (2013.01)

(58) Field of Classification Search
  CPC ........ H03F 1/303; H03F 1/0222; H03F 3/245; H03F 2200/114; H03F 2200/27
  USPC .................................................. 330/10, 251
  See application file for complete search history.

(56) References Cited

U.S. PATENT DOCUMENTS

| | | | |
|---|---|---|---|
| 7,352,211 B1 | 4/2008 | Araujo et al. | |
| 9,899,972 B2 * | 2/2018 | Lee | H03F 3/2173 |
| 10,756,709 B1 | 8/2020 | Wang et al. | |

* cited by examiner

*Primary Examiner* — Andrea Lindgren Baltzell
*Assistant Examiner* — Khiem D Nguyen
(74) *Attorney, Agent, or Firm* — Mitch Harris, Atty at Law, LLC; Andrew M. Harris

(57) ABSTRACT

Techniques for reducing electromagnetic interference (EMI) in a switching amplifier circuit, control edge-rate with reduced sensitivity to process and temperature variations and that is reduced with increasing power supply voltage. The techniques control current levels in a pre-driver stage that drives an output driver of a switching amplifier circuit, according to a bias control. A first slope of a variation of the bias control with respect to a power supply voltage of the switching amplifier circuit over a first portion of a range of variation of the power supply voltage has a direction opposite a second slope of the variation of the reference output current with respect to the power supply voltage over a second portion of the range of variation of the power supply voltage. The resulting operation reduces electromagnetic interference generated by the driver over the second portion of the range of variation of the power supply voltage.

20 Claims, 6 Drawing Sheets

PARAMETRIC-INSENSITIVE EDGE RATE CONTROL IN SWITCHED-POWER CIRCUITS WITH TAILORED POWER SUPPLY VOLTAGE SENSITIVITY

BACKGROUND

1. Field of Disclosure

The field of representative embodiments of this disclosure relates to switched-power amplifiers and other switched-power systems employing edge rate control, and in particular, to an edge rate control scheme that has a controlled response to variation in power supply voltage and is insensitive to process and temperature parameter variations.

2. Background

Switched-power circuits are commonly used in power supplies and amplification systems due to high power efficiency and reduced magnetic component weight and size. By switching current at a frequency greater than the frequencies to be reproduced by an amplifier, or by switching energy generally, in the case of switching power supplies, the size of magnetic components is reduced and losses required by linear circuit operation are eliminated.

However, one of the drawbacks to switched-power operation is generation of electromagnetic interference (EMI) with other circuits, and with control circuits of the switched-power systems themselves, due to the switching of current/voltage into an output stage. The greater the edge rate, i.e., the slope of the rise and fall of the output signal, the greater both the induced and radiated EMI components at the switching frequency, and harmonics of the switching frequency.

Therefore, edge rate control is commonly employed in such switched-power circuits, via tuned rise-time/fall-time of the output waveform. One mechanism that is employed to control the edge rate of the output stage of switched-power circuits is provided by controlling the current provided by a pre-driver circuit to the output driver stage, thereby controlling the edge rate directly, by controlling the slope of the charging of gate capacitance(s) of an output field-effect transistor(s), or by reducing the switching gain in bi-polar junction transistor (BJT) output circuits.

However, the amount of EMI produced by a switched-power circuit is proportional to the voltage being switched, and the voltage, which may typically be the full power supply voltage available in a switched-power circuit. The power supply voltage is frequently varied in such systems, either to tailor efficiency or due to reduced voltage available in battery-powered applications, in which the battery terminal voltage declines as the battery is discharged. Further, control of the output driver current in switched-power circuits is exacerbated by variation over process and temperature, due to output device characteristic variations. Therefore, the EMI generated by a switched-power output stage and associated circuit routing/components will vary significantly in dependence on the available power supply voltage, the die temperature and process.

Therefore, it would be advantageous to provide a switched-power circuit having edge rate control that has a controlled edge rate so that the edge rate is reduced with an increase in power supply voltage, resulting in a reduced EMI profile that is more uniform over power supply variation, while reducing effects of process and temperature variations.

SUMMARY

A more uniform EMI profile via a controlled edge rate that reduces with an increase in power supply voltage, while reducing effects of process and temperature variations, is provided in a circuit and a method.

The circuit is a circuit for generating a reference output current having a controlled dependence on a power supply voltage, which may be used to set the current level in a pre-driver stage of a switching amplifier, or other switched-power circuit. The circuit includes a first current reference supplied by the power supply voltage that generates a first output current that is independent of a variation of the power supply voltage and dependent on process and temperature variations, a second current reference supplied by the power supply voltage that generates a second output current that is dependent on the variation of the power supply voltage and dependent on the process and the temperature variations, and a reference output circuit that generates the reference output current from the first and the second output current with a controlled output characteristic, so that a first slope of a variation of the reference output current with respect to the power supply voltage over a first portion of a range of variation of the power supply voltage has a direction opposite a second slope of the variation of the reference output current with respect to the power supply voltage over a second portion of the range of variation of the power supply voltage.

The method is a method of reducing electromagnetic interference (EMI) in a switching amplifier circuit. The method includes controlling current levels in a pre-driver stage that provides an output to an input of an output driver of the switching amplifier circuit, according to a bias control, and generating the bias control such that a first slope of a variation of the bias control with respect to a power supply voltage of the switching amplifier circuit over a first portion of a range of variation of the power supply voltage has a direction opposite a second slope of the variation of the reference output current with respect to the power supply voltage over a second portion of the range of variation of the power supply voltage, whereby electromagnetic interference generated by the output driver is reduced over the second portion of the range of variation of the power supply voltage.

In some embodiments, the method and circuit reduce process and temperature variation of the edge rate, by generating the second output current through a diode-connected transistor of a same device type as a corresponding output transistor of the output driver, so that the process and temperature variation of the driver circuit is tracked in the generation of the second reference current. In some embodiments, the method and circuit reduce further process and temperature (PT) variation using a PT compensation circuit that generates a compensating bias voltage provided to the first current reference to control the first output current.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in

DETAILED DESCRIPTION OF ILLUSTRATIVE EMBODIMENT

The present disclosure encompasses systems, circuits and integrated circuits that control the edge-rate of switched-power amplifiers or other switched-power circuits by controlling a current level in a pre-driver stage that controls the output driver stage of the switched-power circuit, according to a bias control, with reduced sensitivity to process/temperature (PT) variations, and that is reduced with increasing power supply voltage. A first slope of a variation of the bias control with respect to a power supply voltage of the switching amplifier circuit over a first portion of a range of variation of the power supply voltage has a direction opposite a second slope of the variation of the reference output current with respect to the power supply voltage over a second portion of the range of variation of the power supply voltage. The resulting operation reduces electromagnetic interference generated by the driver over the second portion of the range of variation of the power supply voltage.

Figure 1:
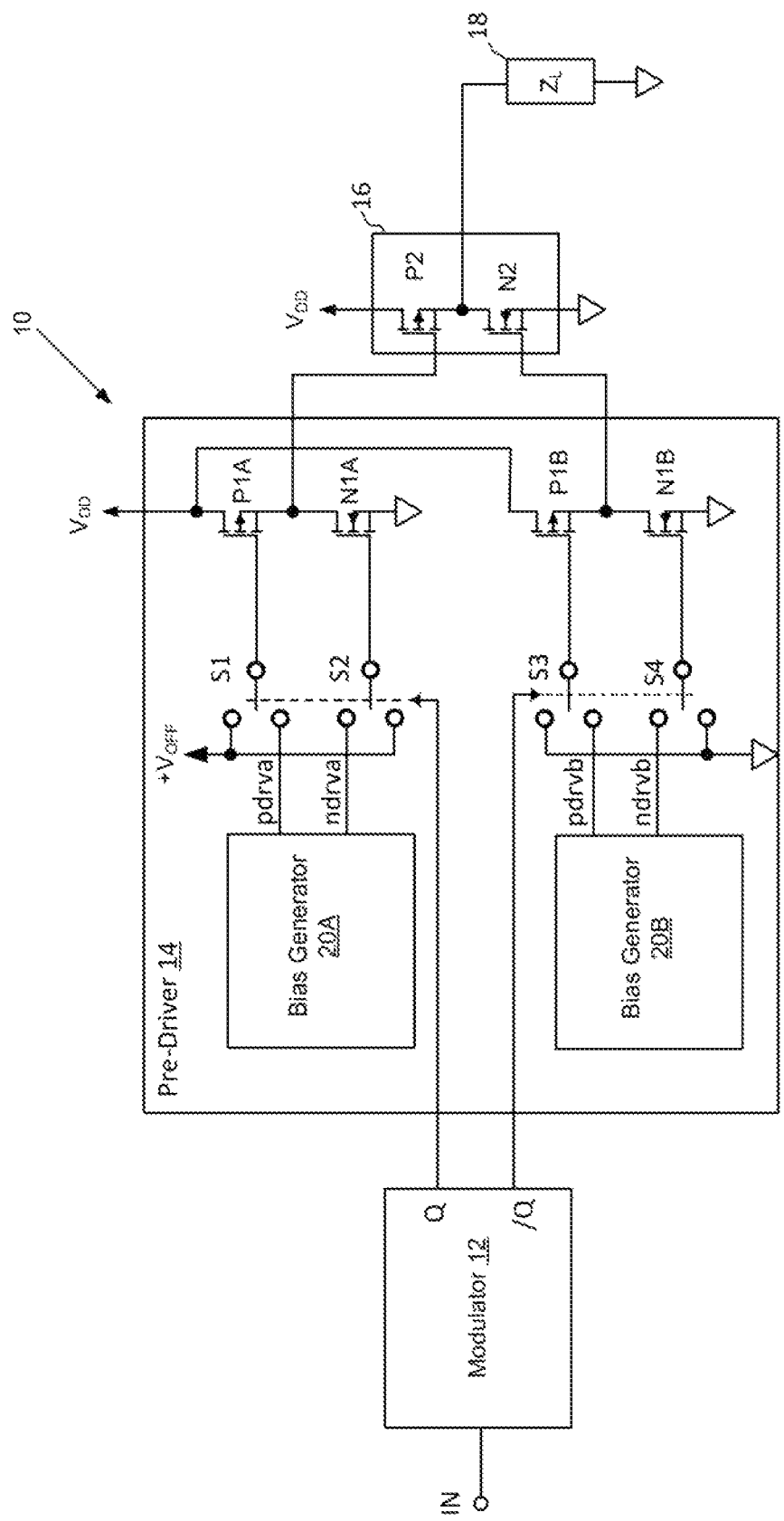
FIG. 1 is a simplified schematic diagram illustrating an example switched-power amplifier 10, in accordance with an embodiment of the disclosure.

Referring now to FIG. 1, a simplified schematic diagram illustrating an example switched-power amplifier 10 is shown, in accordance with an embodiment of the disclosure. A modulator 12, which may be, for example, a pulse-width modulator (PWM) consecutive-edge modulator (CEM), pulse-position modulator (PPM) or other suitable modulator, generates control signals that operate a pre-driver circuit 14 that generates output signals that control the inputs of an output driver circuit 16. The outputs of pre-driver circuit 14 are current-controlled by bias generator circuits 20A, 20B, that control the edge-rate of output driver stage 16, which is illustrated as a half-bridge consisting of transistors P2 and N2, but which may alternatively be a full-bridge or single transistor output driver circuit, and the scope of the disclosure is not limited to a particular output driver configuration. Output driver stage provides one or more output signals to a load 18, and the connections to load 18 and load 18 itself may generally radiate or induce excessive EMI in the vicinity of switched-power amplifier 10, without sufficient control of the edge rate of the output(s) of output driver stage 16, which is accomplished by the control of the current flowing through pre-driver output transistors P1A, N1A and P1B, N1B, which controls the rate of voltage rise on the gates of output driver transistors P2 and N2, thereby controlling the rate of rise of the output signal provided to load 18. Switches S1-S4 control application of drive signals prdrva, ndrva pdrvb, and ndrvb according to the outputs of modulator 12. An off-state voltage $V_{OFF}$ is applied to the gates of p-channel transistors P1A, P1B when in the off state, and the gates of n-channel transistors may also be set in the off-state with a bias voltage, or set to ground, as illustrated.

Bias generators 20A, 20B include circuits, the details of which are described below that may control the currents in pre-driver output transistors P1A, N1A and P1B, N1B to stabilize the output edge-rate of switched-power system 10 with respect to PT variations, and to reduce the edge-rate with increasing voltage of power supply $V_{DD}$, since the amount of EMI is directly related to the output voltage swing across load 18. It is therefore desirable to taper the output edge-rate of switched-power system 10 as the voltage of power supply $V_{DD}$ increases.

Figure 2:
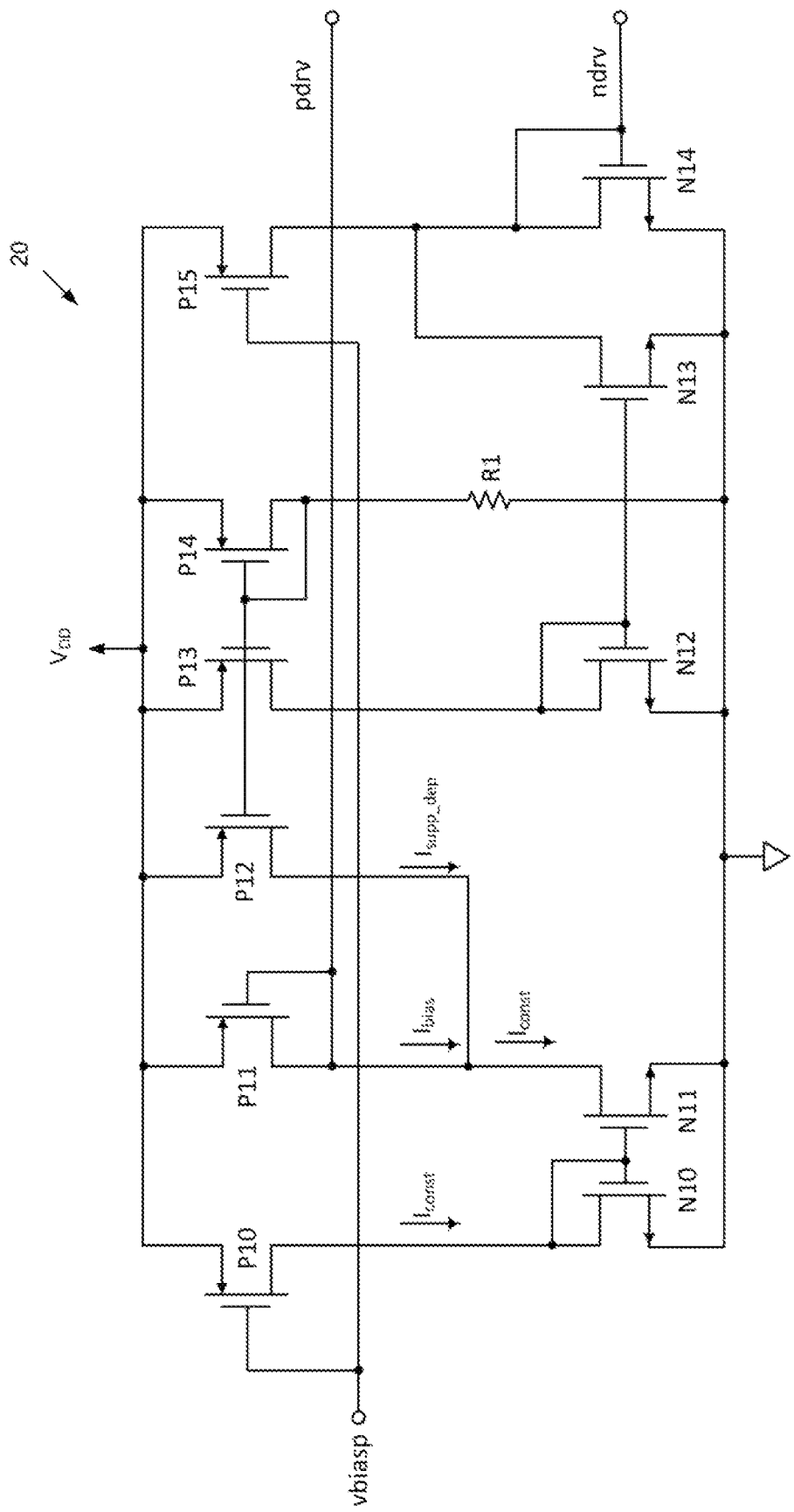
FIG. 2 is a schematic diagram illustrating details of an example bias circuit 20, that may be used to implement bias circuits 20A, 20B example switched-power amplifier 10 of FIG. 1, in accordance with an embodiment of the disclosure.

Referring now to FIG. 2, a schematic diagram illustrating details of an example bias circuit 20, that may be used to implement bias circuits 20A, 20B example switched-power amplifier 10 of FIG. 1 is shown, in accordance with an embodiment of the disclosure. A constant-current source, having a current level $I_{const}$ set by a bias voltage input vbiasp, is provided from a transistor P10, and mirrored by a current mirror formed by transistors N10 and N11. The constant current iconst through transistor N11 enforces a relationship between a current $I_{bias}$ provided by transistor P11 and a supply-voltage-dependent current $I_{supp\_dep}$ provided through a transistor P12, such that the sum of supply-voltage-dependent current $I_{supp\_dep}$ and current $I_{bias}$ is constant and equal to constant current $I_{const}$. The characteristics of transistor P11 are matched to that of pre-driver output transistor P1A in pre-driver circuit 14 of FIG. 1, and transistors P11 and P1A are configured as a current mirror, so that the voltage at the gate of transistor P11, which is provided as output pdrv to transistor P1A of pre-driver 14 in FIG. 1, will cause transistor P1A to conduct a current proportional to current $I_{bias}$ conducted by transistor P11, according to a current-mirroring ratio. Supply voltage-dependent current $I_{supp\_dep}$ is provided from a transistor P12, which mirrors a current through transistor P13 and a diode-connected transistor P14, that is of the same device type as transistor P2 of output driver stage 16, which provide some compensation for process and temperature variations of the output edge rate. Transistors P13 and P14 form part of a current mirror that mirrors a current through a resistor R1. Since the voltage across resistor R1 is $V_{DD}$-VT, where $V_{DD}$ is the voltage of power supply $V_{DD}$ and VT is the threshold voltage of diode-connected transistor P14, voltage-dependent current $I_{supp\_dep}$ is linearly-dependent on the voltage of power supply $V_{DD}$, and increases with increasing power supply voltage. Since the sum of bias current $I_{bias}$ and supply voltage-dependent current $I_{supp\_dep}$ is produced through transistor N11, the summing of currents $I_{bias}$, $I_{supp\_dep}$ from transistors P11 and P12 effectively subtracts supply voltage-dependent current $I_{supp\_dep}$ from constant current $I_{const}$, which yields a bias current $I_{bias}$ that decreases with increasing power supply voltage. The result is that the voltage on output pdrv will control the current in pre-driver circuit 20A to reduce the current as power supply voltage $V_{DD}$ increases. The resulting operation maintains a more constant EMI profile of output stage 16 with power supply voltage. By adjusting the resistance of resistor R1, the degree of decrease of bias current $I_{bias}$ with increasing power supply voltage can be adjusted, making it possible to fine tune an example bias circuit 20, e.g., by trimming resistor R1 at factory test.

The above description of the P-channel driver bias pdrv also applies to an N-channel driver bias ndrv. A transistor N13 mirrors supply-dependent current $I_{supp\_dep}$ conducted through transistor N12 and a transistor N14, which is of the same type as transistor N1A in output driver stage 16 in FIG. 1. Transistor P15 conducts a current equal to constant current $I_{const}$, and since the gate of transistor P15 is connected to the gate of transistor P10 and bias voltage vbiasp, the mirroring of supply-dependent current $I_{supp\_dep}$ through transistor N13 effectively subtracts supply-dependent current $I_{supp\_dep}$ from constant current $I_{const}$ to produce bias current $I_{bias}$ through transistor N14. Bias voltage vbiasp may be supplied from a voltage reference, such as a band-gap reference, or, as described below with reference to FIG. 3, constant current $I_{const}$ may be provided by a current reference that is tailored to further cancel the output edge-rate variation of switched-power amplifier 10 with process and temperature, in accordance with an alternative embodiment of the disclosure.

Figure 3:
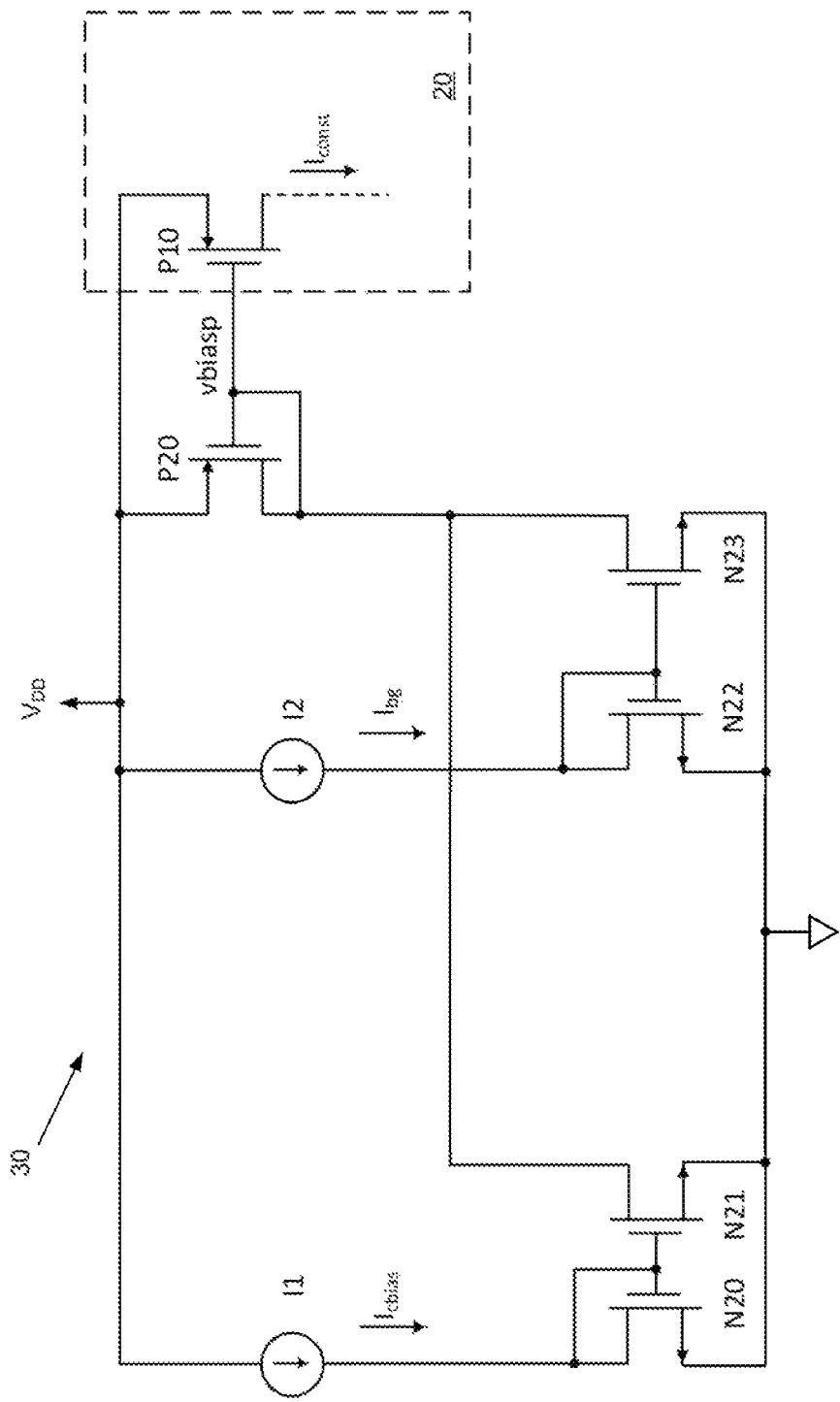
FIG. 3 is a schematic diagram illustrating details of an example current reference circuit 30, that may be used to further cancel process and temperature variation in bias circuit 20 of FIG. 2, in accordance with an embodiment of the disclosure.

Referring now to FIG. 3, a schematic diagram illustrating details of an example current reference circuit 30, that may be used to generate constant current $I_{const}$ in bias circuit 20 of FIG. 2 is shown, in accordance with an embodiment of the disclosure. Current reference circuit 30 uses two separate current sources I1 and I2 as a basis for generating constant current $I_{const}$ as an output from transistor P10. Current source I1 is a precision current reference that is PVT independent, i.e., independent of process, power supply voltage and temperature variation, while current source I2 is a current reference that is process and temperature (PT) dependent, but independent of power supply voltage, such as a bandgap current reference. Current source I1 is mirrored by a current mirror formed by transistors N20 and N21, while current source I2 is mirrored by a current mirror formed by transistors N22 and N23. A transistor P20 supplies input current to both current mirrors via transistors N21 and N23, so that the current through transistor P20 is a sum of both PVT-independent current $I_{cbias}$ and PT-dependent, V-independent current Ing. Transistor P20 forms a current mirror with transistor P10 of bias circuit 20 to generate constant current $I_{const}$ in bias circuit 20 of FIG. 2. By making one or both of current sources I1, I2 trimmable, e.g., at factory test, edge-rate PT variation due to pre-driver output transistors P1A, N1A and P1B, N1B and output driver transistors P2 and N2 may be compensated for.

Figure 4A:
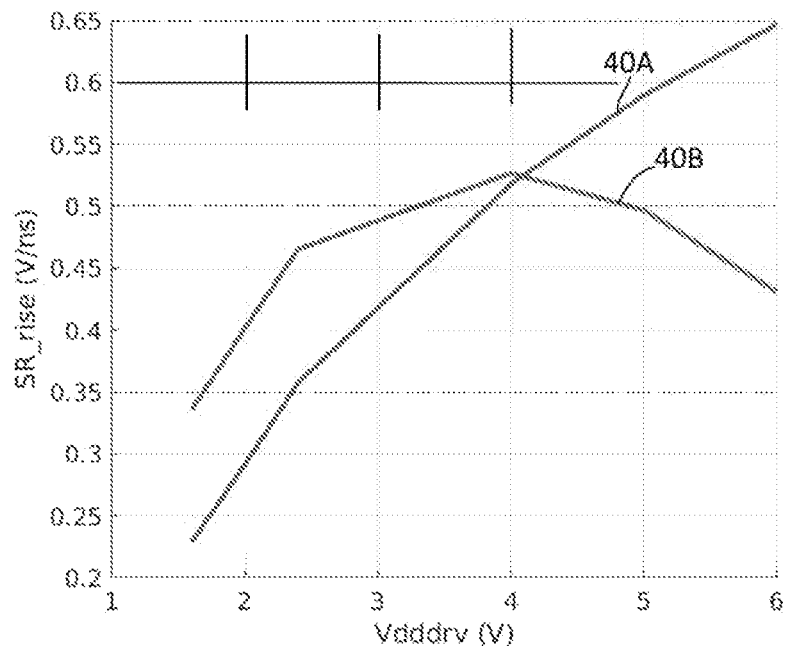
FIG. 4A and FIG. 4B are graphs illustrating example characteristics of system 10 of FIG. 1, in accordance with an embodiment of the disclosure.
Figure 4B:
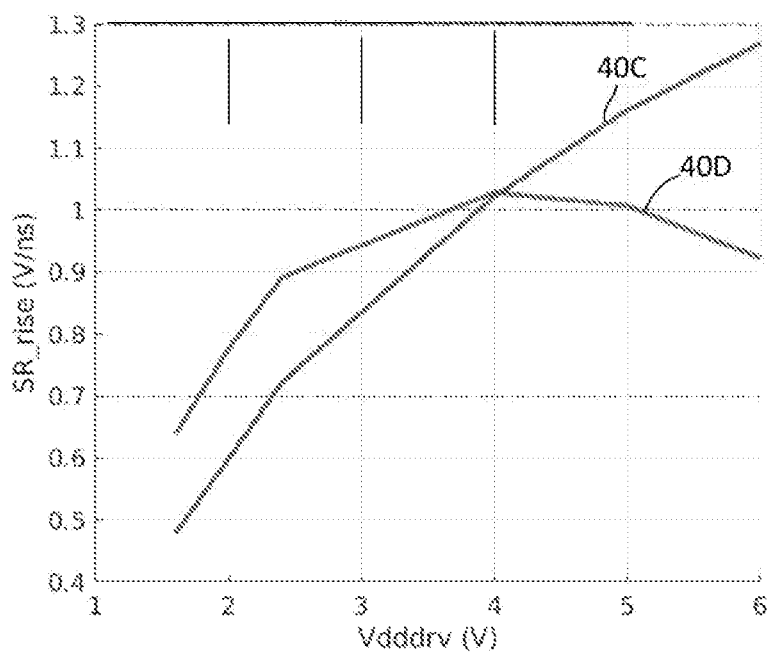

Referring now to FIG. 4A and FIG. 4B, graphs illustrating example characteristics of system 10 of FIG. 1 are shown, in accordance with an embodiment of the disclosure. FIG. 4A illustrates a risetime variation with power supply voltage curve 40A for a first designed pre-driver current level for switched-power amplifier 10 without subtracting voltage-dependent current in bias generator 20 of FIG. 2, and the risetime variation with power supply voltage curve 40B with the voltage-dependent current subtraction, which results in a reduction in EMI variation relative to the characteristic illustrated in curve 40A. FIG. 4B, similarly illustrates a risetime variation with power supply voltage curve 40C for a second designed pre-driver current level for switched-power amplifier 10 without subtracting voltage-dependent current in bias generator 20 of FIG. 2, and the risetime variation with power supply voltage curve 40D with the voltage-dependent current subtraction.

Figure 5A:
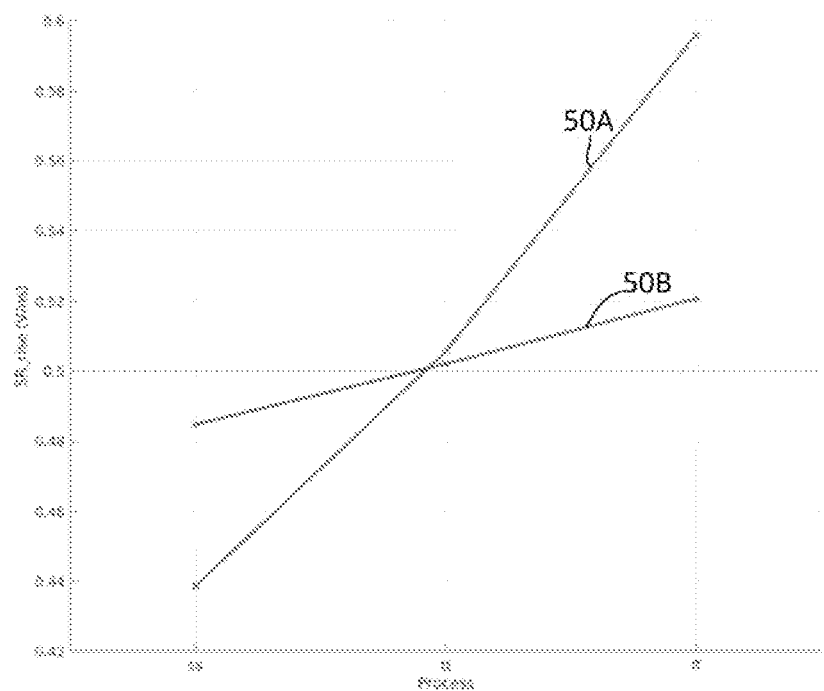
FIG. 5A and FIG. 5B are graphs illustrating example characteristics of system 10 of FIG. 1, in accordance with an embodiment of the disclosure.
Figure 5B:
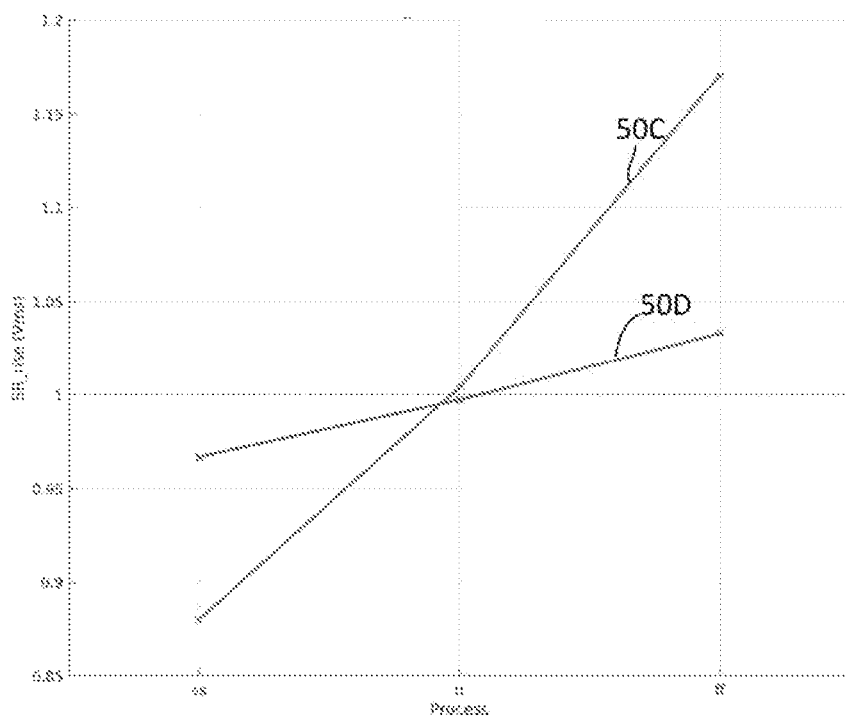

Referring now to FIG. 5A and FIG. 5B, graphs illustrating example characteristics of system 10 of FIG. 1 are shown, in accordance with an embodiment of the disclosure. FIG. 5A illustrates a risetime variation with process 50A for the first designed pre-driver current level for switched-power amplifier 10 without the process variation compensation provided by current reference circuit 30 of FIG. 3, and the risetime variation with process 50B for the process-variation compensated result including current reference circuit 30 of FIG. 3, which results in a reduction in variation of generated EMI relative to the characteristic illustrated in curve 50A. Similarly, FIG. 5B illustrates a risetime variation with process 50C for a second designed pre-driver current level for switched-power amplifier 10, without the process variation compensation provided by current reference circuit 30 of FIG. 3, and the risetime variation with process 50D for the process-variation compensated result including current reference circuit 30 of FIG. 3.

Figure 6:
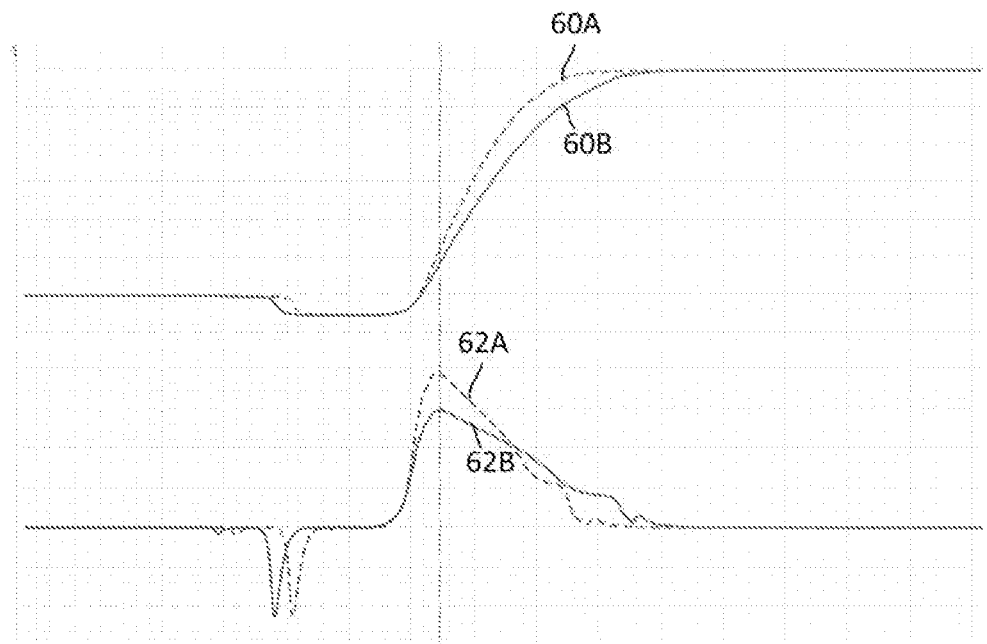
FIG. 6 is a graph illustrating example output waveforms of system 10 of FIG. 1, in accordance with an embodiment of the disclosure.

Referring now to FIG. 6, a graph illustrating example output waveforms of system 10 of FIG. 1 are shown, in accordance with an embodiment of the disclosure. Waveform 60A illustrates output provided to load 18 in system 10 without subtracting power supply voltage-dependent current in bias generator 20 of FIG. 2 at maximum power supply voltage $V_{DD}$ and waveform 60B illustrates the output with the subtraction of the power supply voltage-dependent current. Waveforms 62A and 62B illustrate the time derivative of waveforms 60A and 60B, respectively, showing an approximately 25% reduction in peak edge-rate.

In summary, this disclosure shows and describes techniques and circuits for managing EMI produced by a switched-power amplifier, or other switched-power system/circuit. The circuits may include a first current reference supplied by the power supply voltage that may generate a first output current that is independent of a variation of the power supply voltage and dependent on process and temperature variations. The circuits may also include a second current reference supplied by the power supply voltage that may generate a second output current that is dependent on the variation of the power supply voltage and dependent on the process and the temperature variations. The circuits may also include a reference output circuit that generates the reference output current from the first and the second output current with a controlled output characteristic so that a first slope of a variation of the reference output current with respect to the power supply voltage over a first portion of a range of variation of the power supply voltage may have a direction opposite a second slope of the variation of the reference output current with respect to the power supply voltage over a second portion of the range of variation of the power supply voltage. The methods may reduce electromagnetic interference (EMI) in a switched-power circuit and may include controlling current levels in a pre-driver stage that provides an output to an input of an output driver of the switching amplifier circuit, according to a bias control, and generating the bias control such that a first slope of a variation of the bias control with respect to a power supply voltage of the switching amplifier circuit over a first portion of a range of variation of the power supply voltage has a direction opposite a second slope of the variation of the reference output current with respect to the power supply voltage over a second portion of the range of variation of the power supply voltage, by reducing an edge rate of an output stage of the switched-power circuit as the power supply voltage increases in the second portion of the range.

In some example embodiments, the circuit may include a driver circuit for generating a power output signal and a pre-driver circuit having an output coupled to an input of the driver circuit. The pre-driver circuit may have an output current controlled by the reference output current for controlling an edge rate of the driver circuit, so that electromagnetic interference generated by the driver circuit is reduced over the second portion of the range of variation of the power supply voltage. In some example embodiments, the driver circuit may be an audio power output stage of a class-D amplifier. In some example embodiments, the second current reference may include a diode-connected transistor and a resistor series-coupled with the diode-connected transistor that provides the dependence of the second output current on the power supply voltage. The diode-connected transistor may be of a same device type as an output transistor of the driver circuit, to that the process and temperature variation of the driver circuit is tracked in the generation of the second output current.

In some example embodiments, the first current reference may include a PT compensation circuit that varies the first output current with process and temperature to reduce variation of the edge rate of the driver circuit with process and temperature. In some example embodiments, the PT compensation circuit may generate a bias voltage provided to the first current reference to control the first output current. In some example embodiments, the PT compensation circuit may include a third current reference that generates a third output current that is sensitive to process and temperature variations, a fourth current reference that generates a fourth output current that is insensitive to the process and temperature variations, and a current combining circuit that generates the bias voltage dependent on a sum of the third output current and the fourth output current.

In some example embodiments, the current combining circuit may generate the bias voltage with a current mirror that mirrors the sum of the third output current and the fourth output current into a transistor of the first current reference by providing the bias voltage to a gate of the transistor of the first current reference. In some example embodiments, at least one of the third current reference or the fourth current reference may be trimmable, e.g., at factory test, to adjust variation of the edge rate of the driver circuit with process and temperature.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to another type of output stage and system.

What is claimed is:

1. A circuit for generating a reference output current having a controlled dependence on a power supply voltage, the circuit comprising:
    a first current reference supplied by the power supply voltage that generates a first output current that is independent of a variation of the power supply voltage and dependent on process and temperature variations;
    a second current reference supplied by the power supply voltage that generates a second output current that is dependent on the variation of the power supply voltage and dependent on the process and the temperature variations; and
    a reference output circuit that generates the reference output current from the first and the second output current with a controlled output characteristic so that a first slope of a variation of the reference output current with respect to the power supply voltage over a first portion of a range of variation of the power supply voltage has a direction opposite a second slope of the variation of the reference output current with respect to the power supply voltage over a second portion of the range of variation of the power supply voltage.

2. The circuit of claim 1, further comprising:
    a driver circuit for generating a switched-power output signal; and
    a pre-driver circuit having an output coupled to an input of the driver circuit and having an output current controlled by the reference output current for controlling an edge rate of the driver circuit, whereby electromagnetic interference generated by the driver circuit is reduced over the second portion of the range of variation of the power supply voltage by reducing the edge rate of the driver circuit as the power supply voltage increases in the second portion of the range.

3. The circuit of claim 2, wherein the second current reference comprises a diode-connected transistor and a resistor series-coupled with the diode-connected transistor that provides the dependence of the second output current on the power supply voltage.

4. The circuit of claim 3, wherein the diode-connected transistor is of a same device type as a corresponding output transistor of the driver circuit, whereby the process and temperature variation of the driver circuit is tracked in the generation of the second output current.

5. The circuit of claim 2, wherein the driver circuit is an audio power output stage of a class-D amplifier.

6. The circuit of claim 1, wherein the first current reference further comprises a PT compensation circuit that varies the first output current with process and temperature to reduce variation of the reference output current with process and temperature.

7. The circuit of claim 1, wherein PT compensation circuit generates a bias voltage provided to the first current reference to control the first output current.

8. The circuit of claim 7, wherein the PT compensation circuit comprises:
    a third current reference that generates a third output current that is sensitive to process and temperature variations;
    a fourth current reference that generates a fourth output current that is insensitive to the process and temperature variations; and
    a current combining circuit that generates the bias voltage dependent on a sum of the third output current and the fourth output current.

9. The circuit of claim 8, wherein the current combining circuit generates the bias voltage with a current mirror that mirrors the sum of the third output current and the fourth output current into a transistor of the first current reference by providing the bias voltage to a gate of the transistor of the first current reference.

10. The circuit of claim 9, wherein at least one of the third current reference or the fourth current reference is trimmable to adjust variation of the reference output current with process and temperature.

11. A method of reducing electromagnetic interference (EMI) in a switched-power circuit, the method comprising:
    controlling current levels in a pre-driver stage that provides an output to an input of an output driver of the switching amplifier circuit, according to a bias control; and
    generating the bias control such that a first slope of a variation of the bias control with respect to a power supply voltage of the switching amplifier circuit over a first portion of a range of variation of the power supply voltage has a direction opposite a second slope of the variation of the reference output current with respect to the power supply voltage over a second portion of the range of variation of the power supply voltage, whereby electromagnetic interference generated by the output driver—is reduced over the second portion of the range of variation of the power supply voltage by reducing an edge rate of an output stage of the switched-power circuit as the power supply voltage increases in the second portion of the range.

12. The method of claim 11, wherein the generating the bias control comprises:
first generating a first reference current that is independent of a variation of the power supply voltage and dependent on process and temperature variations;
second generating a second reference current that is dependent on the variation of the power supply voltage and dependent on the process and the temperature variations; and
combining the first reference current and the second reference current to generate the bias control as a reference output current.

13. The method of claim 12, wherein the second reference current is generated by current reference that includes a diode-connected transistor and a resistor series-coupled with the diode-connected transistor that provides the dependence of the second reference current on the power supply voltage.

14. The method of claim 13, wherein the diode-connected transistor is of a same device type as a corresponding output transistor of the output driver, whereby the process and temperature variation of the driver circuit is tracked in the generation of the second reference current.

15. The method of claim 12, wherein the first generating generates the first reference current by varying the first reference current with process and temperature to reduce variation of the edge rate of the output driver with process and temperature.

16. The method of claim 15, wherein the varying is performed by generating a bias voltage of a current mirror that generates the first reference current.

17. The method of claim 16, wherein the generating a bias voltage comprises:
generating a third reference current that is sensitive to process and temperature variations by a third current reference;
generating a fourth reference current that is insensitive to the process and temperature variations by a fourth current reference; and
summing the third reference current and the fourth reference current to generate the bias voltage.

18. The method of claim 17, wherein the generating the bias voltage generates the bias voltage with a current mirror that mirrors the sum of the third reference current and the fourth reference current into a transistor of a first current reference that generates the first reference current by providing the bias voltage to a gate of a transistor of the first current reference.

19. The method of claim 18, further comprising trimming at least one of the third reference current or the fourth reference current to adjust a variation of the edge rate of the output stage of the switched-power circuit with process and temperature.

20. The method of claim 19, wherein the trimming is performed by altering the third reference current reference or the fourth reference current at factory test.

* * * * *